(12) United States Patent
Liao et al.

(10) Patent No.: US 11,448,955 B2
(45) Date of Patent: Sep. 20, 2022

(54) MASK FOR LITHOGRAPHY PROCESS AND METHOD FOR MANUFACTURING THE SAME

(71) Applicant: TAIWAN SEMICONDUCTOR MANUFACTURING CO., LTD., Hsinchu (TW)

(72) Inventors: Chi-Hung Liao, New Taipei (TW); Yueh-Lin Yang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

(21) Appl. No.: 16/255,654

(22) Filed: Jan. 23, 2019

(65) Prior Publication Data

US 2020/0103744 A1 Apr. 2, 2020

Related U.S. Application Data

(60) Provisional application No. 62/737,875, filed on Sep. 27, 2018.

(51) Int. Cl.
*G03F 1/22* (2012.01)
*G03F 1/24* (2012.01)
(Continued)

(52) U.S. Cl.
CPC .................. *G03F 1/24* (2013.01); *G03F 1/22* (2013.01); *G03F 1/48* (2013.01); *G03F 1/60* (2013.01);
(Continued)

(58) Field of Classification Search
CPC ................ H01L 21/6833; H01L 21/027; H01L 21/32139; H01L 21/3086; H01L 21/0337;
(Continued)

(56) References Cited

U.S. PATENT DOCUMENTS 4,807,218 A * 2/1989 Gerber ............... G11B 7/00455
347/247
5,825,607 A * 10/1998 Burkhart ............. H01L 21/6831
361/234
(Continued)

FOREIGN PATENT DOCUMENTS

JP 2010-122304 * 6/2010
JP 2012-009537 * 1/2012
(Continued)

OTHER PUBLICATIONS

Machine transaltion of jp 2013-074195 (2013).*
Machine translation of jp 2012-238645 (2012).*

*Primary Examiner* — Martin J Angebranndt
(74) *Attorney, Agent, or Firm* — Maschoff Brennan

(57) ABSTRACT

A mask includes a substrate, a light-reflecting structure, a patterned layer, and a plurality of bumps. The substrate has a first surface and a second surface. The light-reflecting structure is located on the first surface of the substrate. The patterned layer is located on the light-reflecting structure. The bumps are located on the second surface of the substrate. The bumps define a plurality of voids therebetween and protrude in a direction away from the second surface of the substrate.

20 Claims, 9 Drawing Sheets

(51) Int. Cl.
*G03F 1/48* (2012.01)
*G03F 1/60* (2012.01)
*G03F 7/20* (2006.01)
*H01L 21/033* (2006.01)
*H01L 21/3213* (2006.01)
*H01L 21/308* (2006.01)
*H01L 21/683* (2006.01)

(52) U.S. Cl.
CPC ...... *G03F 7/70033* (2013.01); *H01L 21/0337* (2013.01); *H01L 21/3086* (2013.01); *H01L 21/32139* (2013.01); *H01L 21/6833* (2013.01)

(58) Field of Classification Search
CPC ..... G03F 7/20; G03F 1/46; G03F 1/22; G03F 1/52; G03F 1/48; G03F 1/76; G03F 1/24; G03F 7/0033; G03F 7/70033
See application file for complete search history.

(56) References Cited

U.S. PATENT DOCUMENTS

| | | | | |
|---|---|---|---|---|
| 6,075,375 | A * | 6/2000 | Burkhart | H01L 21/67259 324/662 |
| 6,806,007 | B1 * | 10/2004 | Abdo | B82Y 10/00 430/5 |
| 9,618,856 | B2 * | 4/2017 | Huang | C23C 16/34 |
| 2003/0127605 | A1 * | 7/2003 | Kondo | G03F 7/707 250/492.2 |
| 2003/0161088 | A1 * | 8/2003 | Migita | H01L 21/6831 361/234 |
| 2004/0150172 | A1 * | 8/2004 | Muto | B25B 11/005 279/3 |
| 2005/0134827 | A1 * | 6/2005 | Box | G03F 7/70783 355/72 |
| 2006/0158638 | A1 * | 7/2006 | Maria Zaal | G03F 7/707 355/72 |
| 2007/0160916 | A1 * | 7/2007 | Ikuta | B82Y 40/00 430/5 |
| 2008/0057412 | A1 * | 3/2008 | Huh | B82Y 10/00 430/5 |
| 2008/0268352 | A1 * | 10/2008 | Takai | B82Y 10/00 430/5 |
| 2009/0033889 | A1 * | 2/2009 | Bleeker | G03F 7/70925 355/30 |
| 2009/0284894 | A1 * | 11/2009 | Cooke | H01L 21/6875 361/234 |
| 2011/0116068 | A1 * | 7/2011 | Wilklow et al. | G03B 27/54 355/67 |
| 2012/0127444 | A1 * | 5/2012 | Huh | G03F 9/7088 355/66 |
| 2013/0120897 | A1 * | 5/2013 | Lin | H01L 21/68757 361/234 |
| 2013/0323626 | A1 * | 12/2013 | Chang | G03F 1/58 430/5 |
| 2014/0030639 | A1 * | 1/2014 | Lee | G03F 1/76 430/5 |
| 2014/0192335 | A1 * | 7/2014 | Hagio | G03F 1/24 355/52 |
| 2015/0107621 | A1 * | 4/2015 | Kobayashi | H01L 21/67132 134/6 |
| 2015/0160550 | A1 * | 6/2015 | Kim | G03F 1/38 216/47 |
| 2015/0301441 | A1 * | 10/2015 | Hamamoto | G03F 1/48 430/5 |
| 2016/0049323 | A1 * | 2/2016 | Ye | H02N 13/00 361/234 |
| 2016/0070180 | A1 * | 3/2016 | Hwang | G03F 1/66 355/75 |
| 2016/0202601 | A1 * | 7/2016 | Onoue | G03F 1/24 430/5 |
| 2017/0010527 | A1 | 1/2017 | Orihara et al. | |

FOREIGN PATENT DOCUMENTS

| | | | |
|---|---|---|---|
| JP | 2012-238645 | * | 12/2012 |
| JP | 2013-074195 | * | 4/2013 |
| TW | 201013747 A | | 4/2010 |
| TW | I373069 B | | 9/2012 |
| TW | 201303963 A | | 1/2013 |
| WO | 2015/153774 A1 | | 10/2015 |

* cited by examiner

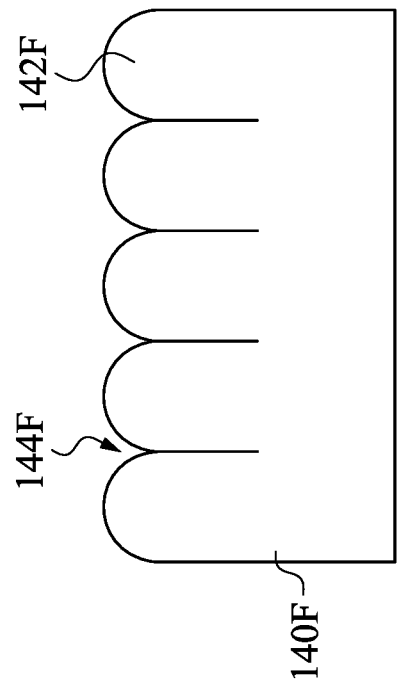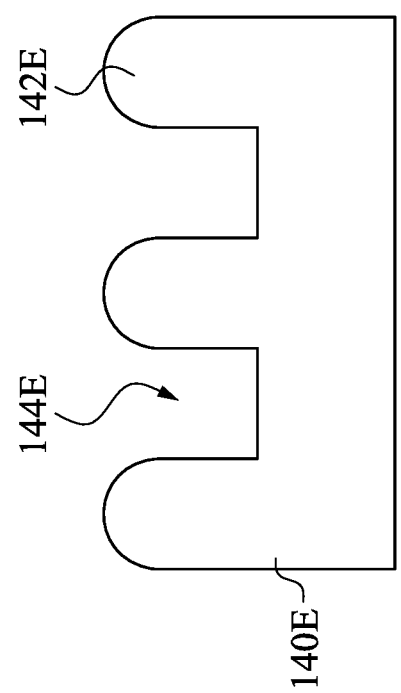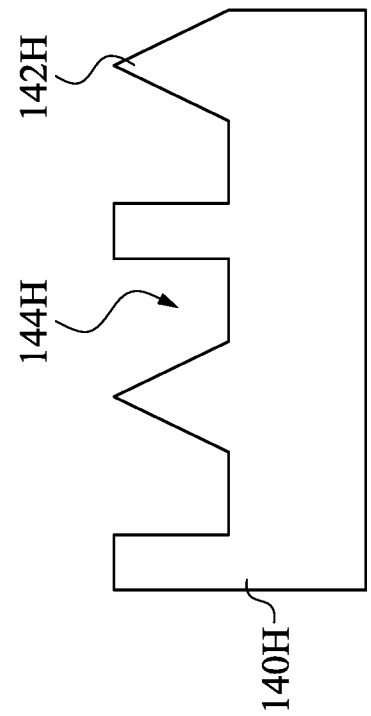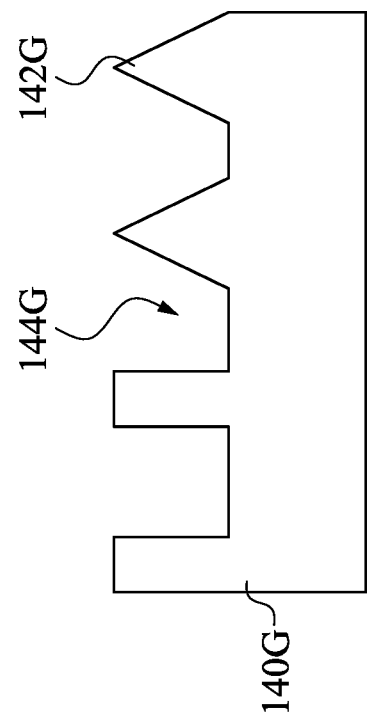

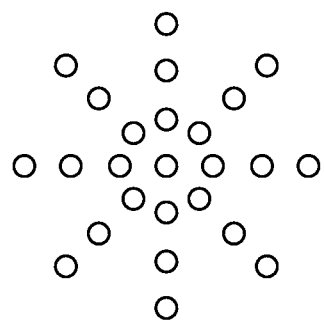
Fig. 6C
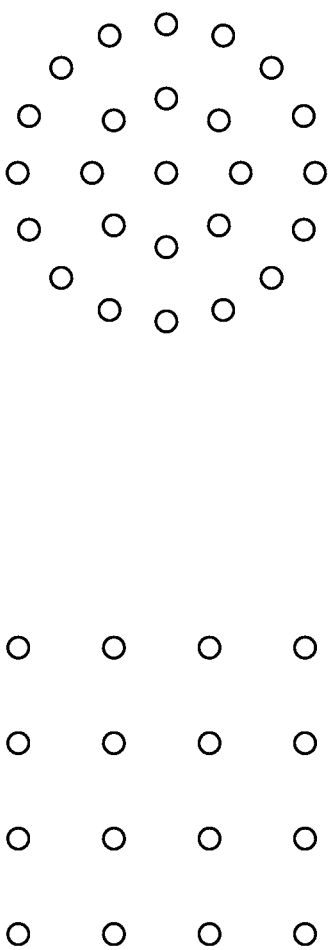
Fig. 6B
Fig. 6A
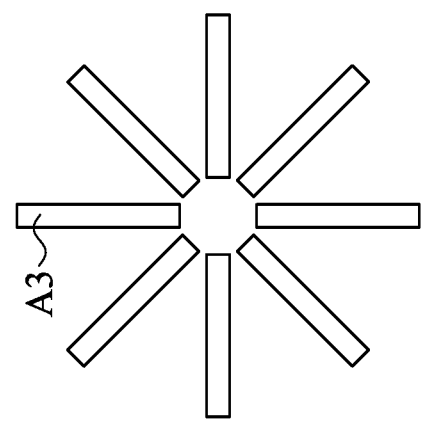
Fig. 6F
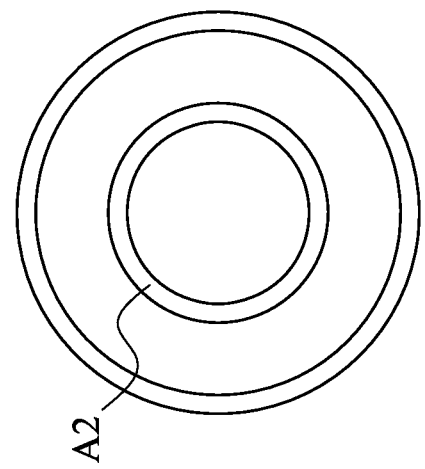
Fig. 6E
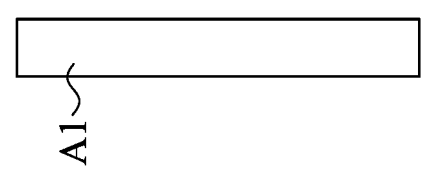
Fig. 6D

MASK FOR LITHOGRAPHY PROCESS AND METHOD FOR MANUFACTURING THE SAME

PRIORITY CLAIM AND CROSS-REFERENCE

This application claims priority to U.S. provisional application Ser. No. 62/737,875, filed on Sep. 27, 2018, which is hereby incorporated by reference in its entirety.

BACKGROUND

The trend of semiconductor manufacturing is substantially towards shrinking the die size and increasing the number of transistors thereon at the same time, i.e., trying to configure more transistors on the die per unit area thereof. A variety of manufacturing processes, such as 14 nm, 10 nm, and 7 nm processes, are sequentially introduced into the semiconductor manufacturing industry to go along with the trend. However, as the gate width (also known as the prefix number of the manufacturing process, such as 14 nm, 10 nm, and 7 nm) becomes smaller, the wavelength of light source applied to the manufacturing process becomes shorter as well. When the manufacturing process moves forward into the 7 nm process, a light source with an extremely short wavelength, such as an extreme ultraviolet (EUV) light source, would fail to be applied to the conventional 193-nm immersion lithography process due to the light absorption issue. Consequently, the EUV lithography process is invented to solve the light absorption issue and further create a semiconductor device with higher performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 5A and 2B to 5B are schematic diagrams illustrating various bumps on a substrate in accordance with some embodiments of the present disclosure.

FIGS. 6A to 6F are schematic top-view diagrams of contact distributions of bumps in accordance with some embodiments of the present disclosure.

DETAILED DESCRIPTION

Figure 1:
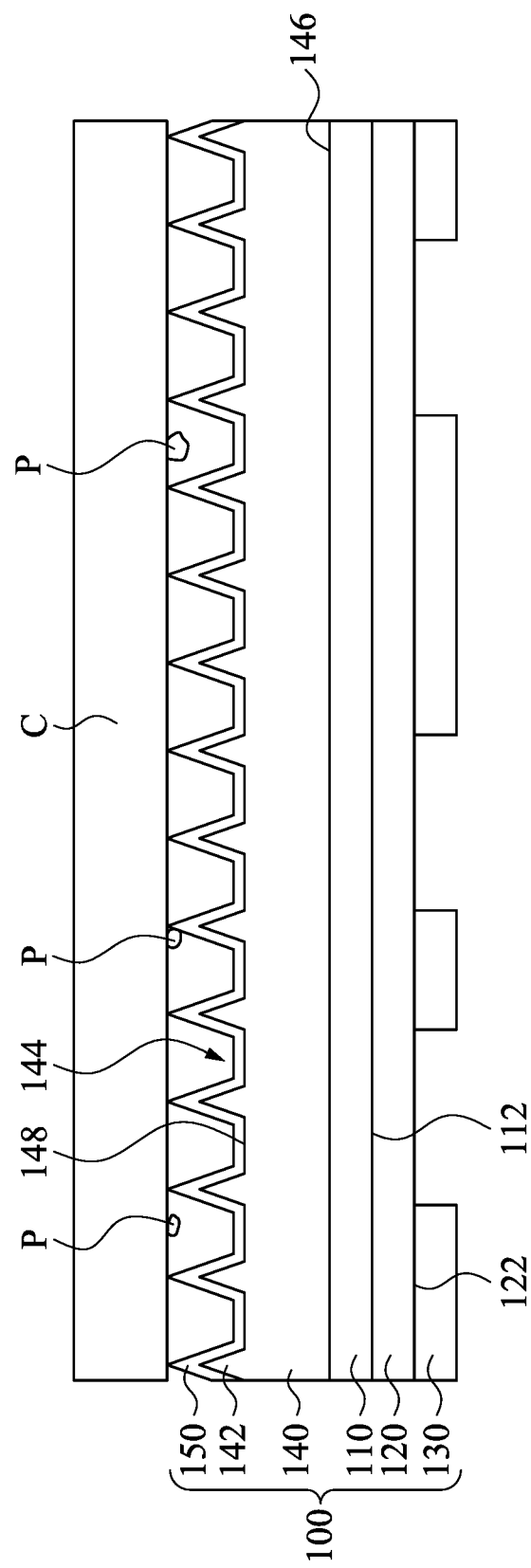
FIG. 1 is a schematic diagram illustrating a mask in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

An extreme ultraviolet (EUV) lithography process utilizes a plurality of mirrors and a reflection-type mask to form a pattern on a target wafer. The reflection-type mask includes multiple layers and is held by an electrostatic device. However, tiny particles usually adhere to a surface of the electrostatic device and/or a backside of the reflection-type mask that movably sticks to the surface of the electrostatic device. These tiny particles present between the electrostatic device and the reflection-type mask will result in problems, such as mask backside particle contamination, lower mask lifetime as a result of frequent mask cleaning, and EUV/Scanner alignment error due to the presence of backside particles. Consequently, some embodiments of the present disclosure presented hereinafter provide a mask that may be applied to an EUV lithography process and a method for fabricating said mask.

Reference is made to FIG. 1, which is a cross-sectional view of a mask 100 in accordance with some embodiments of the present disclosure. The mask 100 includes a light-reflecting structure 110, a capping layer 120, a patterned layer 130, a substrate 140, a plurality of bumps 142, and a protecting layer 150. The substrate 140 has a first surface 146 and a second surface 148. The light-reflecting structure 110 is located on the first surface 146 of the substrate 140. The capping layer 120 is located on the light-reflecting structure 110. The patterned layer 130 is located on the capping layer 120. The bumps 142 are located on the second surface 148 of the substrate 140. The protecting layer 150 is located on the bumps 142 and the second surface 148 of the substrate 140. The first surface 146 is opposite to the second surface 148 of the substrate 140, i.e., the first surface 146 and the second surface 148 face opposite directions. The bumps 142 protrude in a direction away from the second surface 148 of the substrate 140 and define a plurality of voids 144 therebetween. In some embodiments, the mask 100 may have multiple layers arranged in a sequence, such as the sequence of the protecting layer 150, the bumps 142, the substrate 140, the light-reflecting structure 110, the capping layer 120, and the patterned layer 130, or arranged in a converse sequence thereof. It should be noted that the sequence of said multiple layers may be arranged based on various designs.

In some embodiments of the present disclosure, the light-reflecting structure 110 includes a number of alternating layers of materials having different refractive indexes. In some embodiments, a material having a high refractive index may tend to scatter light, and a material having a low refractive index may tend to transmit light. Two types of the aforementioned materials are combined as one film pair. The light-reflecting structure 110 may include a plurality of said film pairs for producing a resonant reflectivity to improve a reflection of an incident light. For example, the film pair may include a molybdenum-silicon film pair (Mo/Si), wherein a Mo layer may be located above or below a Si layer in each film pair. It should be noted that the materials of the film pair may be changed based on various designs, e.g., the film pair may include a molybdenum-beryllium (Mo/Be) film pair or combinations of materials having high and low refractive indexes to EUV light. In embodiments, the light-reflecting structure 110 includes from about 20 to about 80 film pairs. In some embodiments, each Mo/Si film pair has a thickness of about 5 nm to about 7 nm and a total thickness of the light-reflecting structure 110 is from about 100 nm to about 560 nm. It should be also noted that both the number of the film pair and the thickness of the film pair may be changed based on various designs.

In some embodiments, as shown in FIG. 1, the capping layer 120 is located on the surface 112 of the light-reflecting structure 110 for providing protection thereto during any possible etching process. The capping layer 120 includes silicon (Si), ruthenium (Ru) based materials, combinations thereof, or other suitable materials so as to correspondingly protect against said possible etching process. The thickness of the capping layer 120 may also be adjustable based on various designs. However, it should be noted that, if said possible etching process cannot significantly damage the light-reflecting structure 110, the capping layer 120 may be omitted from the configuration of the mask 100.

In some embodiments, the patterned layer 130 is located on the surface 122 of the capping layer 120 and has a variety of patterns formed by at least one etching process. In particular, when the at least one etching process has not been performed, a pre-etching patterned layer is formed on the surface 122 of the capping layer 120. Subsequently, the at least one etching process is conducted to pattern the pre-etching patterned layer, such that the patterned layer 130 is formed on the capping layer 120. Due to the configuration of the capping layer 120, the light-reflecting structure 110 may avoid being etched by the at least one etching process, such that the light-reflecting structure 110 may remain intact and maintain the ability to reflect incident light. On the other hand, the patterned layer 130 can also be considered an absorber that may include chromium, chromium oxide, titanium, titanium nitride, aluminum-copper, tantalum (Ta) based materials, combinations thereof, or the like. It should be noted that the thickness and the composition of the patterned layer 130 may be changed based on various designs, e.g., the patterned layer 130 may have multiple layers with different thicknesses.

In some embodiments, the substrate 140 has the first surface 146 and the second surface 148, as described above. The first surface 146 of the substrate 140 is in contact with the light-reflecting structure 110. The second surface 148 of the substrate 140 faces an electrostatic chuck C. The bumps 142 are located on the second surface 148 of the substrate 140. More specifically, the bumps 142 uniformly protrude in a direction away from the second surface 148 of the substrate 140 and define a plurality of the voids 144 therebetween. Furthermore, the protruding direction is substantially collinear with the normal of the substrate 140, i.e., each of the bumps 142 is substantially symmetrical with respect to a normal of the second surface 148 of the substrate 140. As shown in FIG. 1, when the mask 100 is held by the electrostatic chuck C by an attraction force, the attraction force applied to each of the bumps 142 may be evenly distributed to two sides of each of the bumps 142 rather than focusing on one side thereof, such that the lifetime of each of the bumps 142 may be prolonged. However, it should be noted that the protruding directions of the bumps 142 may be varied so that they are uniform or non-uniform based on various designs, e.g., some of the protruding directions of the bumps 142 and the normal of the substrate 140 may have a first angle therebetween while the other of the protruding directions of the bumps 142 and the normal of the substrate 140 may have a second angle therebetween. The second angle is different from the first angle. When the substrate 140 is held by the electrostatic chuck C, the contact area of the substrate 140 and the electrostatic chuck C becomes smaller due to the configuration of the bumps 142, such that the presence of particles at the contact area may be substantially lowered. Moreover, said voids 144 may substantially act as an accommodating space for particles P, that is, such particles P may be contained in the voids 144. Therefore, both the structural distortion of the mask 100 and the pattern deformation on the target wafer can be prevented.

Additionally, both the substrate 140 and the bumps 142 may include materials having a low coefficient of thermal expansion (CTE), such as TiO$_2$, silicon (Si) based materials, amorphous glass, quartz, other suitable materials, or combinations thereof. Hence, the substrate 140 and the bumps 142 may remain intact when a large amount of heat is transferred from the EUV radiation to the mask 100, such that image distortion resulting from mask heating may be minimized. In some embodiments, a conductive layer may be included in the substrate 140 for improving the attraction between the mask 100 and the electrostatic chuck C.

Figure 14:
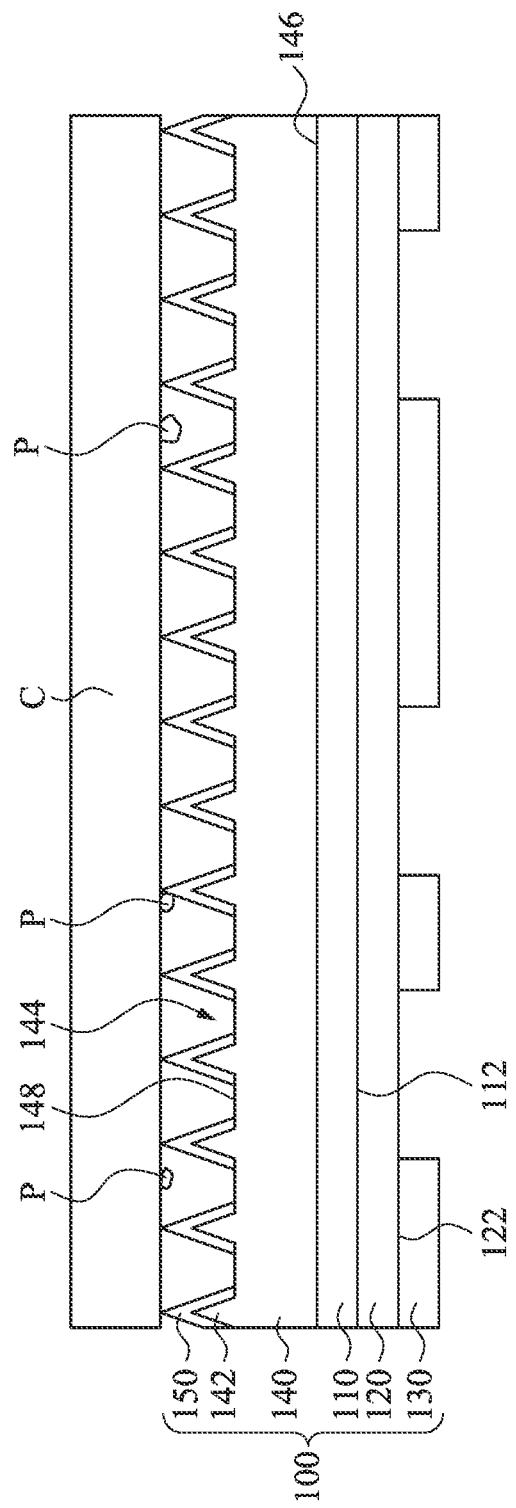
FIG. 14 is a schematic diagram illustrating a mask in accordance with some embodiments of the present disclosure.

In some embodiments, as shown in FIG. 1, the protecting layer 150 is located on the bumps 142 and the second surface 148 of the substrate 140. More specifically, the protecting layer 150 may include a tantalum based material having a low coefficient of thermal expansion (CTE) and a high rigidity, such as tantalum boride (TaB) or the like. Hence, the protecting layer 150 may prevent the bumps 142 therebelow from being damaged when the mask 100 is transferred and/or attached onto the electrostatic chuck C. In some embodiments, the protecting layer 150 may have a thickness ranging between about 5 nm and about 35 nm. If the thickness of the protecting layer 150 is less than about 5 nm, the protecting layer 150 may be too thin to provide enough resistance to impacts from other objects like the electrostatic chuck C. If the thickness of the protecting layer 150 is greater than about 35 nm, waste of the material of the protecting layer 150 may occur. In some embodiments, the protecting layer 150 may cover the bumps 142 and expose the second surface 148 of the substrate 140, as illustrated in FIG. 14.

Figure 2A:
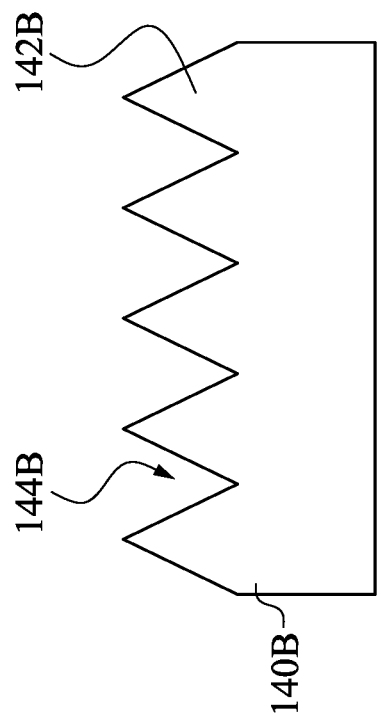

Reference is made to FIG. 2A, which is a schematic diagram illustrating bumps 142 on a substrate 140 in accordance with some embodiments of the present disclosure.

As shown in FIG. 2A, each of the bumps 142 has substantially the same width D1. The bumps 142 are separated from each other by a substantially constant pitch D2. Each of the bumps 142 has substantially the same height D3. A thickness of the mask 100 is denoted as D4.

In some embodiments, the width D1 of the bumps 142 may range between about 1 mm and about 3 mm. The height D3 of the bumps 142 may range between about 0.5 mm and about 1 mm. A ratio of the height D3 to the width D1 (D3/D1) may range between about 1 and about ⅙. Steepness of sidewalls of the bumps 142 is proportional to the ratio of the height D3 to the width D1. When the ratio of the height D3 to the width D1 (D3/D1) is less than about ⅙, the sidewalls of the bumps 142 may be too gentle or the height D3 of the bumps 142 may be too small to provide enough space for the particle. Conversely, when the ratio of the height D3 to the width D1 (D3/D1) is greater than about 1, the bumps 142 may not have a sufficient structural strength.

In some embodiments, the pitch D2 of the bumps 142 may range between about 1 mm and about 3 mm. The thickness D4 of the mask 100 may range between about 5 mm and about 10 mm. A ratio of the pitch D2 to the thickness D4 (D2/D4) may range between about ⅒ and about ⅗. If the ratio of the pitch D2 to the thickness D4 (D2/D4) is greater than about ⅗, the bumps 142 are too sparse to have a sufficient structural strength. Conversely, if the ratio of the pitch D2 to the thickness D4 (D2/D4) is less than about ⅒, the issue of either the accommodating space between two adjacent bumps 142 being too small or the thickness D4 of the mask 100 being too large may occur.

In some embodiments, the height D3 of the bumps 142 may range between about 0.5 mm and about 1 mm. The thickness D4 of the mask 100 may range between about 5 mm and about 10 mm. A ratio of the height D3 to the thickness D4 (D3/D4) may range between about ⅟₂₀ and about ⅕. If the ratio of the height D3 to the thickness D4 (D3/D4) is greater than about ⅕, the bumps 142 are too high to have a sufficient structural strength. Conversely, if the ratio of the height D3 to the thickness D4 (D3/D4) is less than about ⅟₂₀, the issue of either the sidewalls of the bumps 142 being too flat or the thickness D4 of the mask 100 being too large may occur.

Therefore, through properly selecting the width D1 of the bumps 142, the pitch D2 of the bumps 142, the height D3 of the bumps 142, and/or the thickness D4 of the mask 100, the structure of the mask 100 can decrease the contact area between the mask 100 and the electrostatic chuck C, have sufficient accommodating space for containing particles P, and remain intact during the lithography process. Hence, the issue of pattern deformation on the target wafer may be minimized.

In addition, as shown in FIG. 2A, the cross section of each bump 142 on the substrate 140 resembles a triangle with a tip at the upper portion thereof. Due to the configuration of the triangular bumps 142, the contact area between the mask 100 and the electrostatic chuck C (as shown in FIG. 1) may be decreased, such that the presence of particles P at said contact area may also be lowered. It should be noted that said tips of the bumps 142 may be adjusted based on various designs, e.g., said tips may be rounded or formed to be small platforms for adapting to different contacting conditions. In some embodiments, each of the bumps 142 may have a triangular-prism appearance in a perspective view. In some other embodiments, each of the bumps 142 may have a pyramid-shaped appearance in a perspective view. It should be also noted that the appearance of the bumps 142 in a perspective view may be adjustable based on various designs, e.g., the shape of the bump 142 in a perspective view may also be streamlined.

Figure 2B:
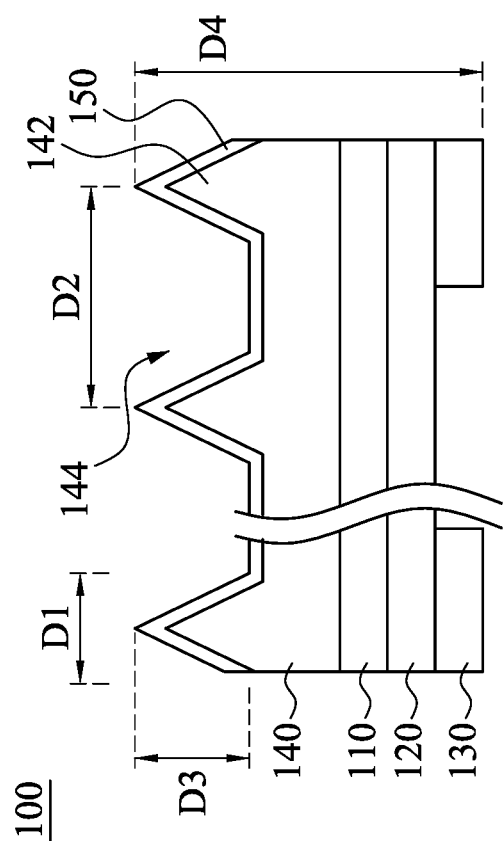

Reference is made to FIG. 2B, which is a schematic diagram illustrating bumps 142B on a substrate 140B in accordance with some embodiments of the present disclosure. Since some components of FIG. 2B are similar to those corresponding components of FIG. 2A above, descriptions for those similar components will not be repeated hereinafter. More specifically, as shown in FIG. 2B, the pitch of the bumps 142B is relatively small in comparison with FIG. 2A. In some embodiments, each of the bumps 142B has a lower portion connected to another one of the bumps 142B in a row without a distance between the lower portions thereof. Hence, the voids 144B formed between the bumps 142B are also relatively small to be suitable for a low-duty cycle of the lithography process since particles P (as shown in FIG. 1) are substantially lower in quantity and smaller in the low-duty cycle. Additionally, due to the above-mentioned configuration, the number of the bumps 142B per unit area on the substrate 140B may be increased to provide even more support to the mask 100.

Figure 3A:
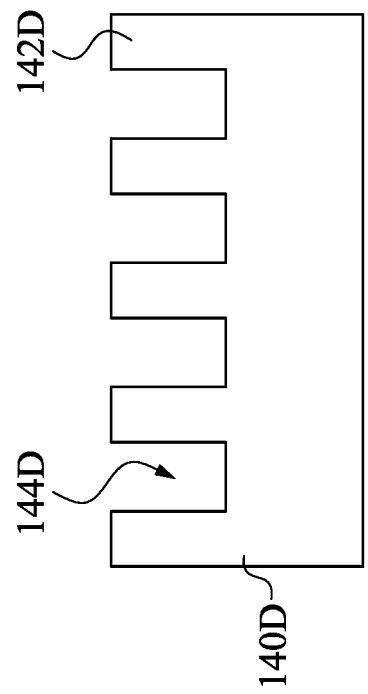
Figure 3B:
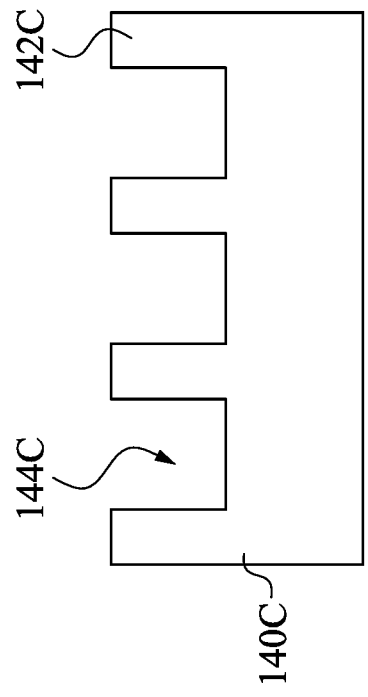

Reference is made to FIGS. 3A and 3B, which are schematic diagrams illustrating bumps 142C, 142D respectively on substrates 140C, 140D in accordance with some embodiments of the present disclosure. Since some components of FIGS. 3A and 3B are similar to those corresponding components of FIGS. 2A and 2B above, descriptions for those similar components will not be repeated hereinafter.

As shown in FIGS. 3A and 3B, the cross section of each bump 142C and 142D respectively on the substrates 140C and 140D resembles a rectangle. Due to the platforms (i.e., substantially flat areas) located at the upper portions of the rectangular bumps 142C and 142D, the support per unit area provided by the bumps 142C and 142D may be increased, such that the structure of the mask may be more stable when the mask is held by the electrostatic chuck C. Additionally, the voids 144C and 144D are respectively formed between the bumps 142C and 142D for accommodating particles P. As described above, the smaller voids 144D are suitable for a low-duty cycle of the lithography process while the larger voids 144C are suitable for a high-duty cycle of the lithography process. It should be noted that the aspect ratios of the rectangular bumps 142C and 142D may be adjusted if their sizes comply with the aforementioned dimension ranges of the bumps.

Reference is made to FIGS. 4A and 4B, which are schematic diagrams illustrating bumps 142E, 142F respectively on substrates 140E, 140F in accordance with some embodiments of the present disclosure. Since some components of FIGS. 4A and 4B are similar to those corresponding components of FIGS. 3A and 3B above, descriptions for those similar components will not be repeated hereinafter.

As shown in FIGS. 4A and 4B, the cross section of each bump 142E and 142F on the substrates 140E and 140F resembles a strip with one roundhead tip. Due to the roundhead tips located at the upper portions of the bumps 142E and 142F, the contact area between the bumps 142E and 142F and the electrostatic chuck may be maintained in an intermediate level in comparison with the triangular and rectangular bumps described above to be suitable for some designs. Additionally, the voids 144E and 144F are respectively formed between the bumps 142E and 142F for accommodating particles P. As described above, the smaller voids 144F are suitable for a low-duty cycle of the lithography process while the larger voids 144E are suitable for a high-duty cycle of the lithography process.

Reference is made to FIGS. 5A and 5B, which are schematic diagrams illustrating bumps 142G, 142H respectively on substrates 140G, 140H in accordance with some embodiments of the present disclosure. In some embodiments, at least two of the bumps on the substrate have different cross sections. As shown in FIG. 5A, the bumps 142G on the substrate 140G include triangular and rectangular cross sections, such that the voids 144G defined by the bumps 142G may have different accommodating spaces. Therefore, through appropriate arrangements of the various bumps 142G and the voids 144G based on the particle distributions, both the prevention of particle-induced mask distortion and the connection between the mask and the electrostatic chuck may be enhanced. For example, if the particles are more likely to be present in a central area of a mask than a peripheral area of the mask, the triangular bumps may be located at the central area and the rectangular bumps may be located at the peripheral area since the triangular bumps may define larger voids therebetween and have a smaller contact area with the electrostatic chuck to minimize the influence of particles while the rectangular bumps may have a larger contact area to enhance the connection between the mask and the electrostatic chuck. Since some components of FIG. 5B are similar to those corresponding components of FIG. 5A above, descriptions for those similar components will not be repeated hereinafter. As shown in FIG. 5B, the different cross sections of the bumps 142H on the substrate 140H are alternately arranged, such that the voids 144H formed between the bumps 142H may alternate as well to be suitable for some designs. It should be noted that the cross sections of the bumps 142G, 142H may be changeable based on various designs, e.g., the bumps 142G, 142H may have different cross sections including triangular, rectangular, and a strip with one round-head tip cross sections.

Reference is made to FIGS. 6A to 6F, which are schematic top-view diagrams of contact distributions of bumps in accordance with some embodiments of the present disclosure. More specifically, the contact distributions of the bumps in FIGS. 6A to 6F are viewed from a top direction normal to and toward the surface of the substrate that faces the electrostatic chuck. As shown in FIG. 6A, the bumps viewed from the top direction are in a square-array distribution. In greater detail, the bumps are respectively represented by small circles that are located at intersections of a plurality of vertical and horizontal lines. As shown in FIG. 6B, the bumps viewed from the top direction are in a concentric-circular-array distribution. In greater detail, the bumps are respectively represented by small circles that are evenly spread out from a center. As shown in FIG. 6C, the bumps viewed from the top direction are in a radial-array distribution. In greater detail, the bumps are respectively represented by small circles that are lined up along a double-crossed direction. As shown in FIG. 6D, the bumps viewed from the top direction are in a paralleled-strip distribution. In greater detail, some of the bumps are located inside an enclosed area A1 defined by a strip and may be arbitrarily arranged therein based on various designs. A plurality of similar strips are evenly parallel to each other. As shown in FIG. 6E, the bumps viewed from the top direction are in a concentric-circle distribution. In greater detail, some of the bumps are located inside an enclosed area A2 defined by a two-circle group and may be arbitrarily arranged therein based on various designs. The first two-circle group including the innermost circle and the adjacent circle substantially defines an enclosed area A2. A plurality of similar two-circle groups are concentric and outwardly located. As shown in FIG. 6F, the bumps viewed from the top direction are in a radial-strip distribution. In greater detail, some of the bumps are located inside an enclosed area A3 defined by a strip and may be arbitrarily arranged in the each strip based on various designs. A plurality of similar strips are located along a radial alignment. In some embodiments, since a variety of patterns may exist at the surface of the electrostatic chuck that contacts the mask, said patterns would make said surface uneven, so that the connection between the mask and the electrostatic chuck becomes more difficult. Through the configurations of the contact distributions of the bumps, the bumps may be correspondingly located in accordance with said patterns, such that each of the bumps may contact the electrostatic chuck and thus said connection may be enhanced.

In some embodiments, as shown in FIG. 1, the voids 144 may be considered a plurality of recesses in a surface of the substrate 140 that faces the electrostatic chuck C. In some embodiments, the protecting layer 150 may be formed along the recesses for enhancing the structural strength of the substrate 140. In some embodiments, at least one of the recesses may taper toward the first surface 146 of the substrate 140 for enhancing the structural strength of the substrate 140.

It should be also noted that, although the bumps mentioned above all include a bottom wider than or equal to a top thereof as shown in FIGS. 1, 2A to 5A, and 2B to 5B, the bumps may also include a bottom narrower than a top thereof based on various designs.

Reference is made to FIGS. 7 to 12, which are schematic diagrams illustrating a method for fabricating a mask at various stages in accordance with some embodiments of the present disclosure.

Figure 7:
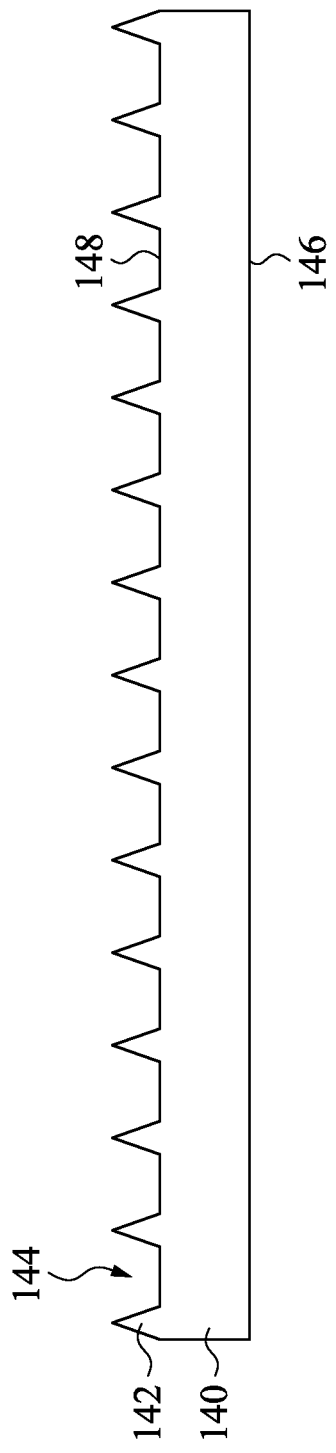
FIGS. 7 to 12 are schematic diagrams illustrating a method for fabricating a mask at various stages in accordance with some embodiments of the present disclosure.

With reference to FIG. 7, a substrate 140 with a plurality of bumps 142 is provided. More specifically, the substrate 140 has a first surface 146 and a second surface 148. The first surface 146 and the second surface 148 are opposite to each other. The bumps 142 are located on the second surface 148 of the substrate 140. In some embodiments, the substrate 140 with the bumps 142 may be formed as a one-piece component through a mold. Further, various bump shapes, such as a triangle, a rectangle, and a strip with one round-head tip, may be arranged and included in the mold to provide substrates with a variety of bumps thereon. In some embodiments, the substrate 140 and the bumps 142 may be fabricated separately and then combined together, such that changing the configuration of the bumps 142 on the substrate 140 may be more convenient. Further, in such embodiments, due to the separate fabrication of the substrate 140 and the bumps 142, a material of the bumps 142 may be the same as or different from that of the substrate 140 based on various designs.

Figure 8:
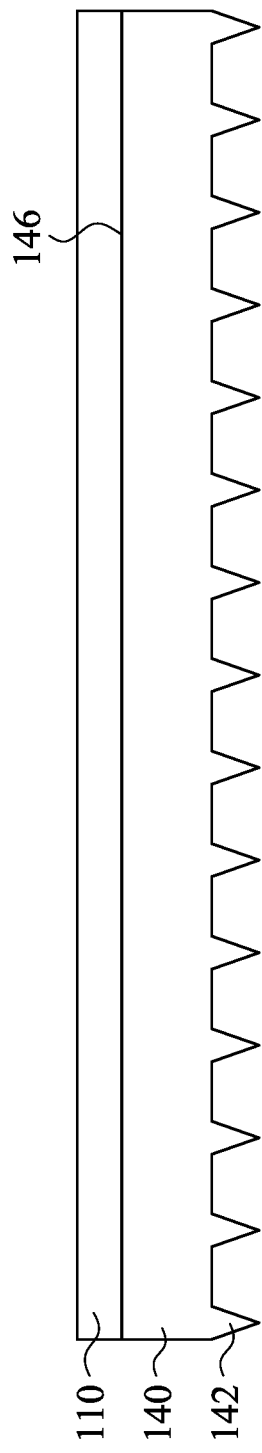

With reference to FIG. 8, after the substrate 140 is rotated to make the first surface 146 thereof face upwardly, a light-reflecting structure 110 is formed on the first surface 146 of the substrate 140. More specifically, the light-reflecting structure 110 may be formed by alternately depositing multiple types of layers having different refractive indexes on the first surface 146. In some embodiments, the light-reflecting structure 110 includes a number of molybdenum-silicon (Mo/Si) film pairs, wherein each Mo/Si film pair includes a Mo layer located above or below a Si layer. Hence, a majority of an incident light may be reflected to irradiate a target wafer.

Figure 9:
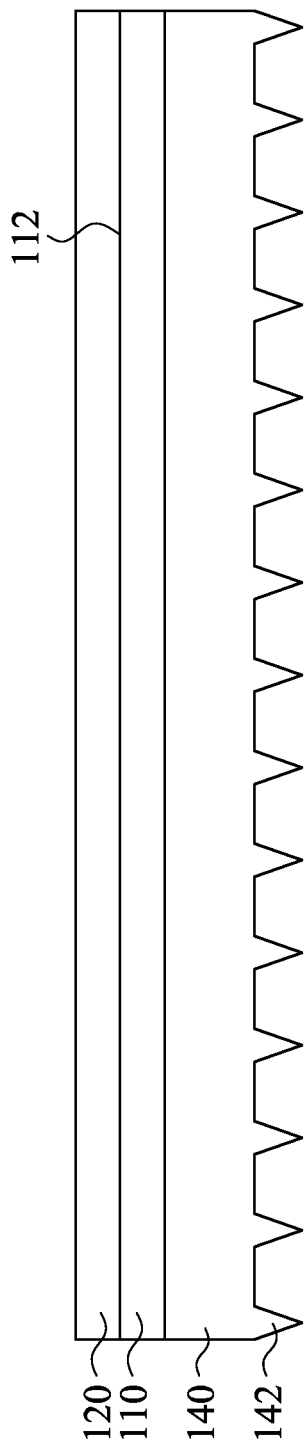

With reference to FIG. 9, a capping layer 120 may be formed on a surface 112 of the light-reflecting structure 110. In some embodiments, the capping layer 120 includes silicon (Si), ruthenium (Ru) based materials, combinations thereof, or other suitable materials, so as to prevent the light-reflecting structure 110 from being etched by the following etching process. However, it should be noted that the capping layer 120 may be omitted from the configuration if the light-reflecting structure 110 below the capping layer 120 can resist the following etching process.

Figure 10:
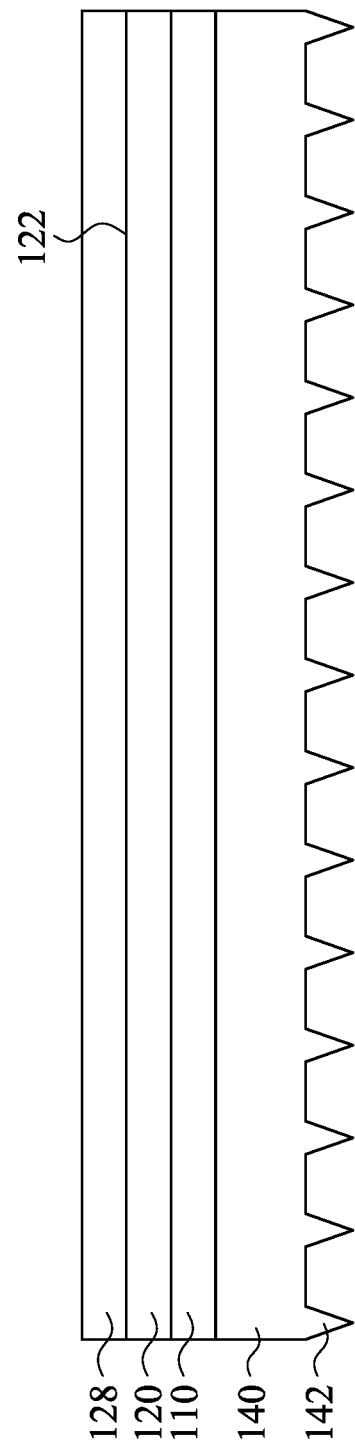

With reference to FIG. 10, a pre-etching patterned layer 128 is formed on a surface 122 of the capping layer 120 by deposition. The pre-etching patterned layer 128 may include chromium, chromium oxide, titanium, titanium nitride, aluminum-copper, tantalum (Ta) based materials, combinations thereof, or the like. In some embodiments, when the capping layer 120 is omitted from the configuration, the pre-etching patterned layer 128 may be directly formed on the surface of the light-reflecting structure 110.

Figure 11:
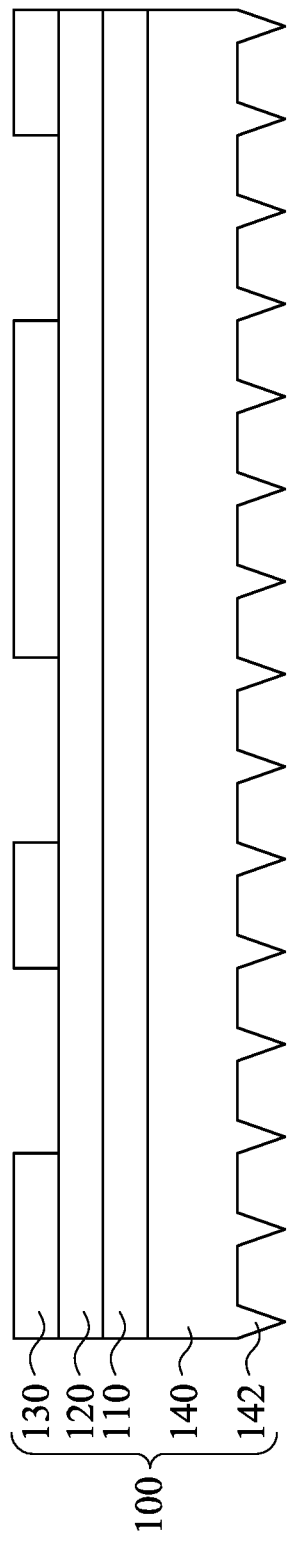

With reference to FIG. 11, the pre-etching patterned layer 128 is patterned by at least one etching process, such that a patterned layer 130 is formed on the capping layer 120. Hence, a portion of an incident light may be absorbed by the patterned layer 130 and the other portion of the incident light may be reflected by the light-reflecting structure 110. In some embodiments, the at least one etching process is stopped at the capping layer 120. In some embodiments, when the capping layer 120 is omitted from the configuration, the at least one etching process is stopped at the light-reflecting structure 110.

Figure 12:
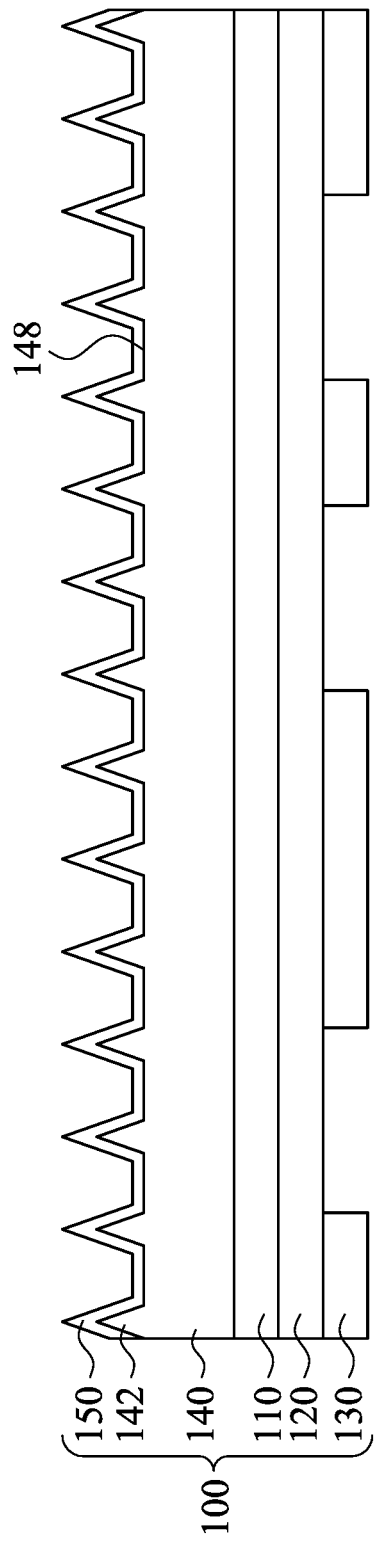

With reference to FIG. 12, after the substrate 140 is rotated to make the second surface 148 thereof face upwardly, a protecting layer 150 is deposited on the bumps 142 and the second surface 148. The protecting layer 150 may include a tantalum based material having a low coefficient of thermal expansion (CTE) and a high rigidity, such as tantalum boride (TaB) or the like. It should be noted that the protecting layer 150 may be formed by a suitable process, e.g., atomic layer deposition (ALD), chemical vapor deposition (CVD), physical vapor deposition (PVD), plasma enhanced chemical vapor deposition (PECVD), low-pressure chemical vapor deposition (LPCVD), sub-atmospheric chemical vapor deposition (SACVD), or combinations thereof. Hence, a mask 100 as described above may be provided.

Figure 13:
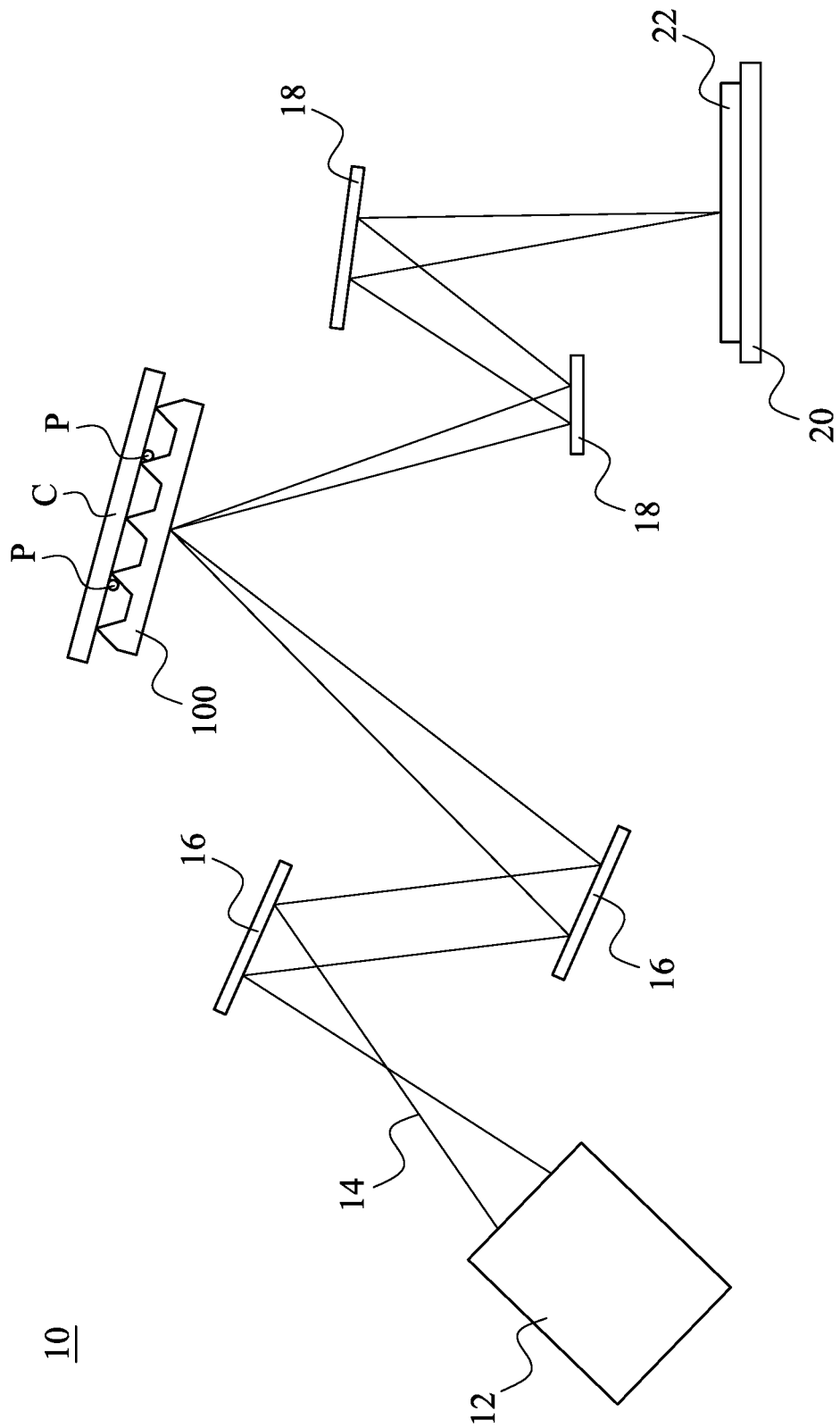
FIG. 13 is a schematic diagram illustrating a photolithography system in accordance with some embodiments of the present disclosure.

Reference is made to FIG. 13, which is a schematic diagram illustrating a photolithography system 10 in accordance with some embodiments of the present disclosure. The photolithography system 10 is operable to perform a photolithography process on a wafer 22. In some embodiments, the photolithography system 10 may include an EUV light source 12, an illuminator module 16, a mask 100, an electrostatic chuck C, a projection optics module 18, and a wafer stage 20. More specifically, the mask 100 is held by the electrostatic chuck C. The mask 100 has a plurality of recesses in a surface of the mask 100 facing the electrostatic chuck C as described above. At least one particle P can be contained in at least one of the recesses when the mask 100 is held using the electrostatic chuck C, so as to prevent particle-induced mask distortion. Subsequently, the EUV radiation 14 is emitted by the EUV light source 12 and then propagates toward the illuminator module 16. The EUV radiation 14 propagating to the illuminator module 16 is reflected by the illuminator module 16 and then condensed to focus on the mask 100. The EUV radiation 14 is reflected by the mask 100 and then propagates toward the projection optics module 18. Consequently, the EUV radiation 14 propagating to the projection optics module 18 is reflected by the projection optics module 18 to expose the wafer 22 held by the wafer stage 20. Through the photolithography system 10, the EUV radiation 14 is directed toward and reflected by the mask 100, such that pattern on the mask 100 may be duplicated onto the wafer 22 through the EUV radiation 14.

The bumps or recesses located on the backside of the mask decrease the contact area of the mask and the electrostatic chuck, such that the presence of particles at the contact area may be substantially lowered. The bumps or recesses also define a plurality of voids, such that the particles between the mask and the electrostatic chuck may be contained in these voids. Therefore, particle-induced mask distortion may be prevented.

In some embodiments, a mask includes a substrate having a first surface and a second surface. A light-reflecting structure is on the first surface of the substrate. A patterned layer is on the light-reflecting structure. A plurality of bumps are on the second surface of the substrate. The bumps define a plurality of voids therebetween and protrude in a direction away from the second surface of the substrate.

In some embodiments, a mask includes a substrate having opposite first and second surfaces and a plurality of recesses in the second surface of the substrate, a light-reflecting structure, and a patterned layer. The substrate and the patterned layer are respectively located on two opposite sides of the light-reflecting structure. The first surface of the substrate faces the light-reflecting structure.

In some embodiments, a photolithography method includes holding a mask using a chuck, generating extreme ultraviolet (EUV) radiation using an EUV light source, and directing the EUV radiation toward the mask such that the EUV radiation is reflected by the mask. The mask has a plurality of recesses in a surface of the mask facing the chuck. At least one particle is present in at least one of the recesses when the mask is held using the chuck.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask comprising:
   a substrate having a first surface and a second surface;
   a light-reflecting structure on the first surface of the substrate;
   a patterned layer on the light-reflecting structure;
   a plurality of bumps on the second surface of the substrate, wherein the substrate and the bumps are defined by a low coefficient of thermal expansion (CTE) material that is a single piece and continuous throughout, the bumps define a plurality of voids therebetween and protrude in a direction away from the second surface of the substrate, the bumps are interconnected by a plurality of flat segments of the second surface of the substrate within the plurality of voids, and the bumps are in a concentric-circle distribution, and a width of each of the bumps ranges between about 1 mm to about 3 mm; and a protecting layer covering the bumps, but not the flat segments of the second surface of the substrate.

2. The mask of claim 1, wherein a ratio of a pitch of the bumps to a thickness of the mask ranges between about $1/10$ and about $3/5$.

3. The mask of claim 2, wherein the pitch of the bumps ranges between about 1 mm to about 3 mm, and the thickness of the mask ranges between about 5 mm to about 10 mm.

4. The mask of claim 1, wherein a ratio of a height of each of the bumps to a thickness of the mask ranges between about $1/20$ and about $1/5$.

5. The mask of claim 1, wherein each of the bumps is substantially symmetrical with respect to a normal of the second surface of the substrate.

6. The mask of claim 1, wherein a ratio of a height of each of the bumps to the width of each of the bumps ranges between about 1 and about $1/6$.

7. The mask of claim 6, wherein the height of each of the bumps ranges between about 0.5 mm to about 1 mm.

8. The mask of claim 1, wherein a cross section of at least one of the bumps resembles a triangle.

9. The mask of claim 1, wherein a cross section of at least one of the bumps resembles a rectangle.

10. The mask of claim 1, wherein each of the bumps has a rounded top.

11. A mask comprising:
a substrate having opposite first and second surfaces and a plurality of recesses in the second surface of the substrate;
a light-reflecting structure;
a first bump and a second bump protruding from the second surface of the substrate, wherein the first bump and the second bump are spaced apart by at least one of the recesses, the first bump and the second bump are in a concentric-circle distribution, a pitch of the first bump and the second bump ranges between about 1 mm to about 3 mm, a thickness of the mask ranges between about 5 mm to about 10 mm, and a ratio of the pitch of the first bump and the second bump to the thickness of the mask is in a range between about $1/10$ and about $3/5$, the first bump and the second bump are interconnected by a flat segment of the second surface of the substrate within said at least one of the recesses, and a width of each of the first bump and the second bump ranges between about 1 mm to about 3 mm;
a patterned layer, wherein the substrate and the patterned layer are respectively located on two opposite sides of the light-reflecting structure, and the first surface of the substrate faces the light-reflecting structure; and
a protecting layer covering the first bump and the second bump, but not the flat segment of the second surface of the substrate.

12. The mask of claim 11, wherein a height of the first bump ranges between about 0.5 mm to about 1 mm.

13. The mask of claim 11, wherein the protecting layer has a low coefficient of thermal expansion.

14. The mask of claim 11, wherein a cross section of the first bump resembles a triangle.

15. A photolithography method, comprising:
holding a mask that includes a substrate using a chuck, wherein the mask has a plurality of recesses in a surface of the mask facing the chuck, each of the recesses has a flat segment spaced apart from the chuck, and at least one particle is present in at least one of the recesses and is spaced apart from the flat segment of said at least one of the recesses when the mask is held using the chuck, the recesses are defined between a plurality of bumps, respectively, that are formed on the substrate, wherein the substrate and the bumps are defined by a low coefficient of thermal expansion (CTE) material that is a single piece and continuous throughout and a ratio of a pitch of the bumps to a thickness of the mask is in a first range between about $1/10$ and about $3/5$, the bumps are interconnected by the flat segments of the surface of the substrate within the plurality of recesses, a width of the bumps ranges between about 1 mm to about 3 mm, and the mask further comprises a protecting layer covering the bumps, but not the flat segments of the surface of the substrate;
determining a distribution of the bumps based on a pattern existing at a surface of the chuck that contacts the mask prior to holding the mask using the chuck such that the bumps are correspondingly located in accordance with the pattern of the chuck;
generating extreme ultraviolet (EUV) radiation using an EUV light source; and
directing the EUV radiation toward the mask, such that the EUV radiation is reflected by the mask.

16. The photolithography method of claim 15, wherein holding the mask is performed such that a portion of the protecting layer of the mask is in contact with the chuck.

17. The method of claim 15, wherein the bumps are in a radial-array distribution or a radial-strip distribution when viewed from above.

18. The method of claim 15, wherein the bumps comprise first, second, third, and fourth bumps, the second bump is between the first and third bumps, the third bump is between the second and fourth bumps, the first bump has a first triangular cross section, the second bump has a first rectangular cross section, the third bump has a second triangular cross section, and the second bump has a second rectangular cross section.

19. The method of claim 15, wherein the pitch of the bumps ranges between about 1 mm to about 3 mm, and the thickness of the mask ranges between about 5 mm to about 10 mm.

20. The method of claim 15, wherein the protecting layer has a low coefficient of thermal expansion.

* * * * *